United States Patent
Kang

(10) Patent No.: US 7,542,286 B2
(45) Date of Patent: Jun. 2, 2009

(54) DISPLAY DEVICE WITH IMPROVED HEAT DISSIPATION

(75) Inventor: Tae-Kyoung Kang, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/744,787

(22) Filed: May 4, 2007

(65) Prior Publication Data
US 2008/0117575 A1 May 22, 2008

(30) Foreign Application Priority Data
Nov. 20, 2006 (KR) ............ 10-2006-0114686

(51) Int. Cl.
*H05K 7/20* (2006.01)

(52) U.S. Cl. ............ 361/690; 361/687; 361/704; 361/707

(58) Field of Classification Search ............ 361/690, 361/704, 707; 165/104.33, 185; 313/46, 313/582; 345/60, 905; 348/748; 349/161
See application file for complete search history.

(56) References Cited

U.S. PATENT DOCUMENTS

| | | | | |
|---|---|---|---|---|
| 6,288,489 B1 * | 9/2001 | Isohata et al. | ............ | 313/582 |
| 7,224,121 B2 * | 5/2007 | Ahn | ............ | 313/582 |
| 7,345,878 B2 * | 3/2008 | Kim | ............ | 361/703 |
| 7,369,400 B2 * | 5/2008 | Bang et al. | ............ | 361/681 |
| 2004/0264130 A1 * | 12/2004 | Liang | ............ | 361/690 |
| 2005/0174726 A1 * | 8/2005 | Bang et al. | ............ | 361/681 |
| 2005/0258749 A1 * | 11/2005 | Ahn | ............ | 313/582 |
| 2005/0286228 A1 * | 12/2005 | Kim | ............ | 361/704 |
| 2006/0044745 A1 * | 3/2006 | Kim | ............ | 361/681 |
| 2006/0119242 A1 * | 6/2006 | Kang et al. | ............ | 313/46 |
| 2006/0133017 A1 * | 6/2006 | Bang | ............ | 361/681 |
| 2006/0133046 A1 * | 6/2006 | Kim et al. | ............ | 361/714 |
| 2006/0158845 A1 * | 7/2006 | Kim | ............ | 361/687 |
| 2006/0232919 A1 * | 10/2006 | Jeong | ............ | 361/681 |
| 2006/0279189 A1 * | 12/2006 | Jeong | ............ | 313/46 |
| 2007/0076396 A1 * | 4/2007 | Kim | ............ | 361/796 |
| 2007/0200797 A1 * | 8/2007 | Kim et al. | ............ | 345/60 |
| 2007/0236874 A1 * | 10/2007 | Jeong | ............ | 361/681 |
| 2007/0290589 A1 * | 12/2007 | Shin | ............ | 313/46 |

FOREIGN PATENT DOCUMENTS

| | | | | |
|---|---|---|---|---|
| JP | 11065485 A | * | 3/1999 | |
| KR | 2003 016498 A | * | 3/2003 | |
| KR | 10-2006-0001375 | | 1/2006 | |
| KR | 10-2006-0086995 | | 8/2006 | |
| KR | 10-2006-0098006 | | 9/2006 | |
| KR | 10-2006-0110505 | | 10/2006 | |

* cited by examiner

*Primary Examiner*—Boris L Chervinsky
(74) *Attorney, Agent, or Firm*—Christie, Parker & Hale, LLP

(57) ABSTRACT

A display device comprising a display panel for displaying an image, a chassis base coupled to the display panel to support the display panel, the chassis base having at least one chassis base hole, and at least one reinforcing member formed on the chassis base such that the at least one reinforcing member covers the at least one chassis base hole.

20 Claims, 6 Drawing Sheets

DISPLAY DEVICE WITH IMPROVED HEAT DISSIPATION

CROSS-REFERENCE TO RELATED APPLICATION

This application claims priority to and the benefit of Korean Patent Application No. 10-2006-0114686, filed in the Korean Intellectual Property Office on Nov. 20, 2006, the entire content of which is incorporated herein by reference.

BACKGROUND OF THE INVENTION

1. Field of the Invention

The present invention relates to a display device, and more specifically, to a plasma display device having a plasma display panel (PDP) with improved heat dissipation.

2. Description of Related Art

A plasma display device is one type of flat panel display device that displays an image using plasma created by gas discharge. A conventional plasma display device includes a PDP, a chassis base for supporting the PDP, and a plurality of driving boards mounted on the chassis base. The driving boards are connected to display electrodes or address electrodes disposed in the PDP through a flexible printed circuit (FPC) and a connector.

The driving boards apply driving voltages to the driving electrodes to control discharge occurring in a discharge space. As a result, the discharge occurs in the discharge space of the PDP, thereby displaying an image and generating heat. The heat generated in the PDP may cause problems in displaying the image. Therefore, a heat dissipation sheet is interposed between the PDP and the chassis base to dissipate the heat generated in the PDP into the chassis base. However, such a conventional arrangement may not effectively dissipate the heat generated.

SUMMARY OF THE INVENTION

An exemplary embodiment of a display device of the present invention includes a plasma display panel for displaying an image, a chassis base coupled to the display panel to support the display panel, the chassis base having at least one chassis base hole, and at least one reinforcing member formed on the chassis base such that the at least one reinforcing member covers the at least one chassis base hole. The at least one reinforcing member may include a first leg spaced from the chassis base and a pair of second legs coupled to the chassis base and configured to space the first leg apart form the chassis base. The first leg may be provided with a reinforcing member hole aligned with the chassis base hole.

Another exemplary embodiment of the present invention includes a heat dissipation sheet between the display panel and the chassis base, and a coupling member coupling the chassis base to the display panel, wherein the coupling member is thicker than the heat dissipation sheet to provide a space between the chassis base. The heat dissipation sheet may be formed around a periphery of the heat dissipation sheet. In one exemplary embodiment of the display panel is a PDP.

A further exemplary embodiment of the present invention includes a plasma display panel using a gas discharge including a chassis base coupled to the display panel to support the display panel, the chassis base having at least one rail extending in a first direction, and at least one reinforcing member formed to straddle the at least one rail. The at least one rail may be integral with the chassis base and may provide a channel between the at least one rail and the chassis base. The rail may have at least one rail hole. Furthermore, the reinforcing member may have a reinforcing member hole aligned with the at least one rail hole.

Another exemplary embodiment of the present invention includes a method for improving heat dissipation from a display device as described with respect to previous embodiments. The method may include aligning a reinforcing member with each chassis base hole, the reinforcing member having a first leg spaced from the chassis base, the first leg having a reinforcing member hole, a pair of second legs configured to space the first leg from the chassis base, and coupling the reinforcing member to the chassis base.

DETAILED DESCRIPTION OF THE EMBODIMENTS

Figure 1:
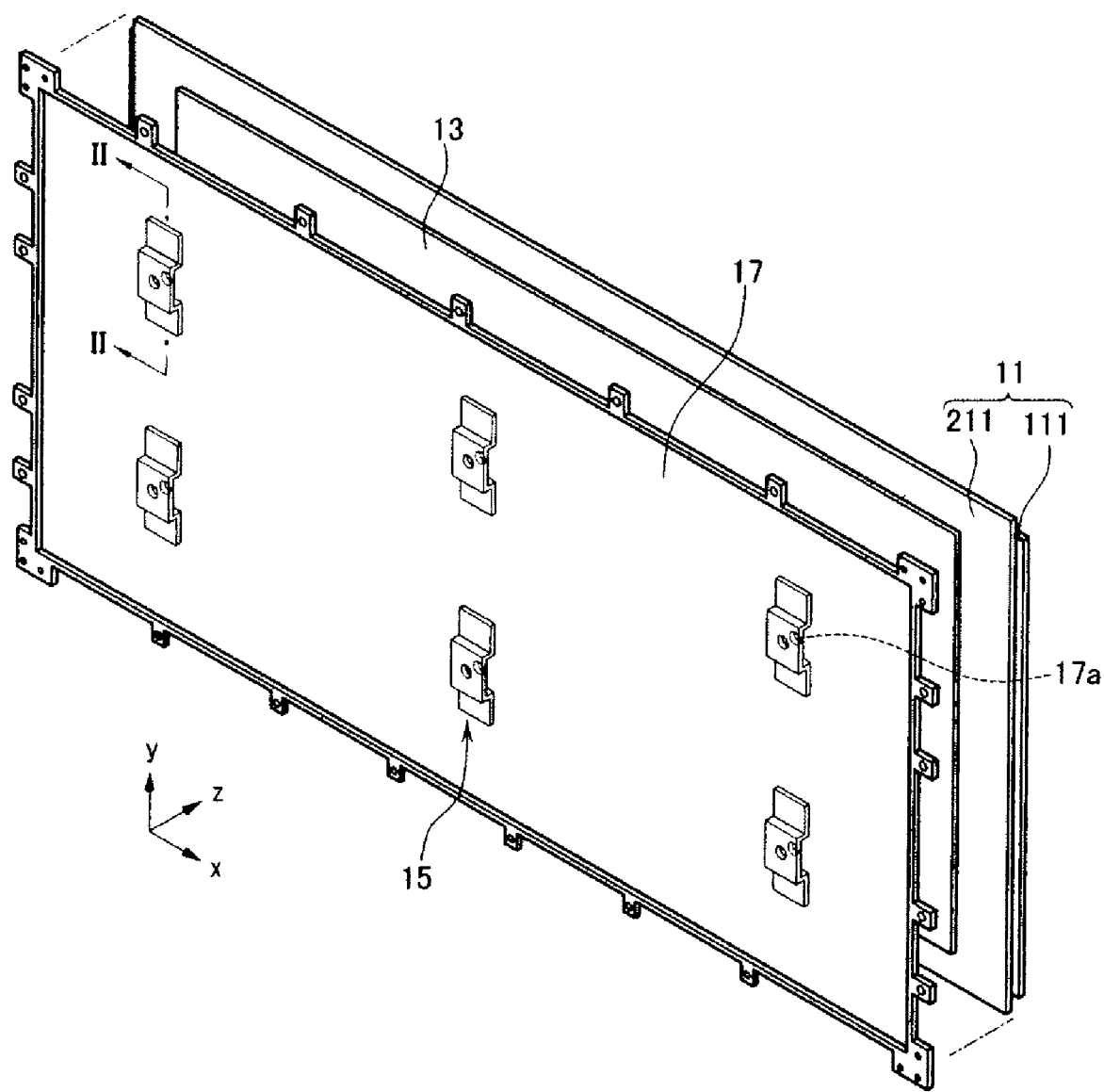
FIG. 1 is a schematic exploded perspective view of a plasma display device according to an exemplary embodiment of the present invention.

Referring to FIG. 1, a plasma display device includes a PDP (hereinafter called "panel") 11 for displaying an image using a gas discharge and a chassis base 17 attached on a first surface of the panel 11. Holes 17*a* and reinforcing members 15 associated with the respective holes are provided on the chassis base 17.

A heat dissipation sheet 13 may be interposed between the first surface of the panel 11 and a first surface of the chassis base 17. The heat dissipation sheet 13 conducts and disperses heat generated from the panel 11 in a planar direction (x-y plane direction). The heat dissipation sheet 13 may be a high thermal-conductive material such as an acryl-based material, a graphite-based material, a metal-based material, or a carbon nanotube-based material.

The panel 11 includes front and rear substrates 111, 211. A space defined between the front and rear substrates 111, 211 is divided to form discharge cells. The discharge cells define respective subpixels each defining a minimum unit for displaying an image. Address electrodes and display electrodes (e.g., pairs of sustain and scan electrodes) cross each other along the discharge cells. The image is displayed by the gas discharge of the discharge cells. The address and display electrodes are electrically connected to the driving boards (not shown) to control the gas discharge of the discharge cells.

The chassis base 17 faces and supports the panel 11. Accordingly, the chassis base 17 includes material having mechanical strength sufficient to support a load of the panel 11. The chassis base 17 also serves to dissipate heat generated from the panel 11 by receiving the heat through a heat dissipation sheet 13.

The chassis base 17 is provided with holes 17*a*. The reinforcing members 15 which reduce the likelihood of the chassis base 17 from being deformed or bent are installed on the chassis base 17 aligned with the respective holes 17*a*.

Figure 2:
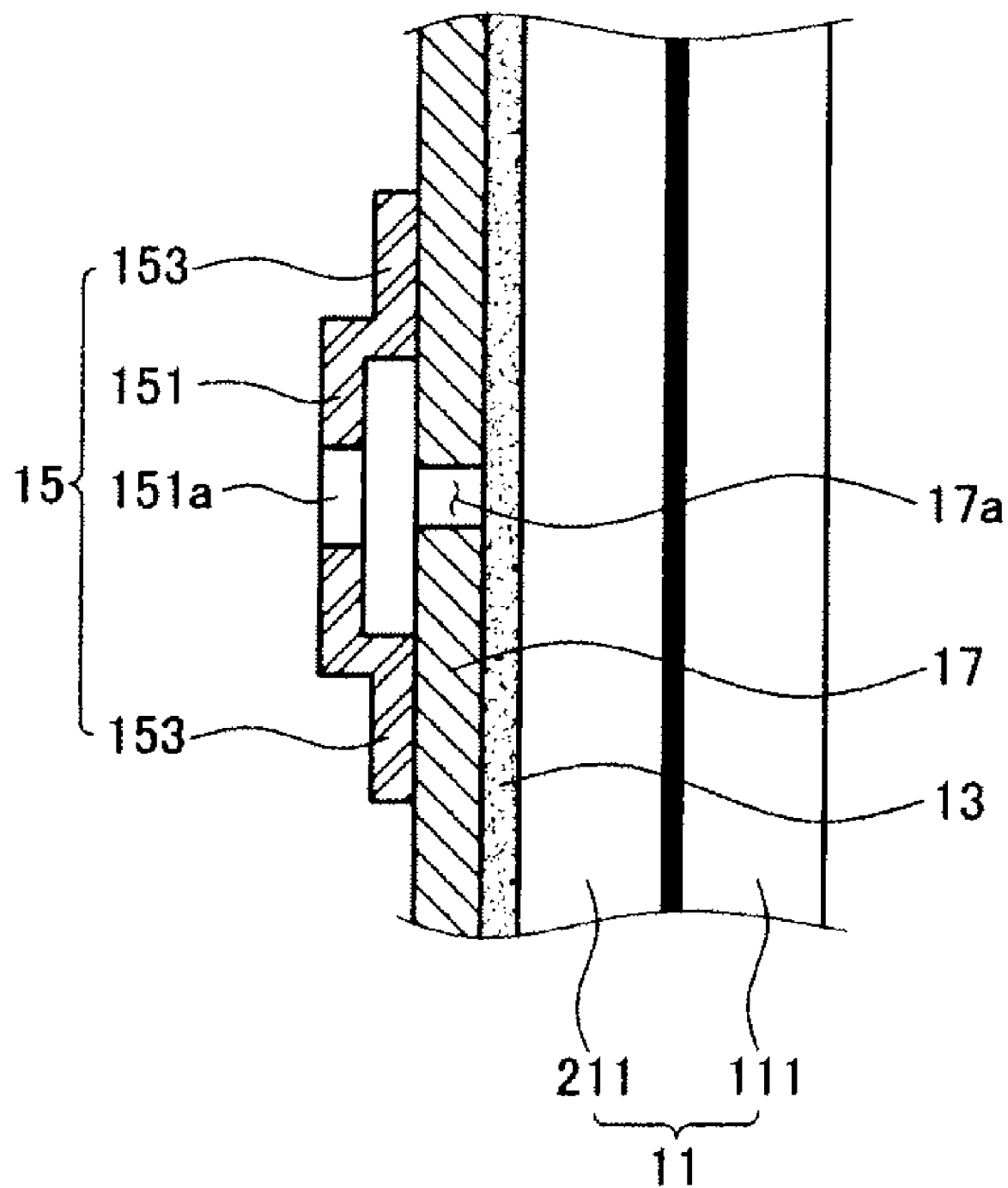
FIG. 2 is a sectional view taken along line II-II of FIG. 1.

Referring to FIG. 2, holes 17*a* formed on the chassis base 17 allow heat transmitted to the heat dissipation sheet 13 to be dissipated. In addition, the hole 17a reduces bubbles generated on a contact surface between the heat dissipation sheet 13 and the chassis base 17 during adhesion of the heat dissipation sheet to the chassis base, thereby enhancing the adhesive force between the heat dissipation sheet and the chassis base.

The hole 17a may cause decreased mechanical strength of the chassis base 17. Accordingly, a reinforcing member 15 is installed on the chassis base 17 associated with the hole 17a. The reinforcing member 15 includes a first leg 151 spaced from the chassis base 17 and a second leg 153 for fixing the reinforcing member 15 to the chassis base 17 and being configured to space the first leg 151 from the chassis base 17. Additionally, the reinforcing member 15 has a hole 151a to more effectively dissipate the heat discharged through the holes 17a.

Figure 3:
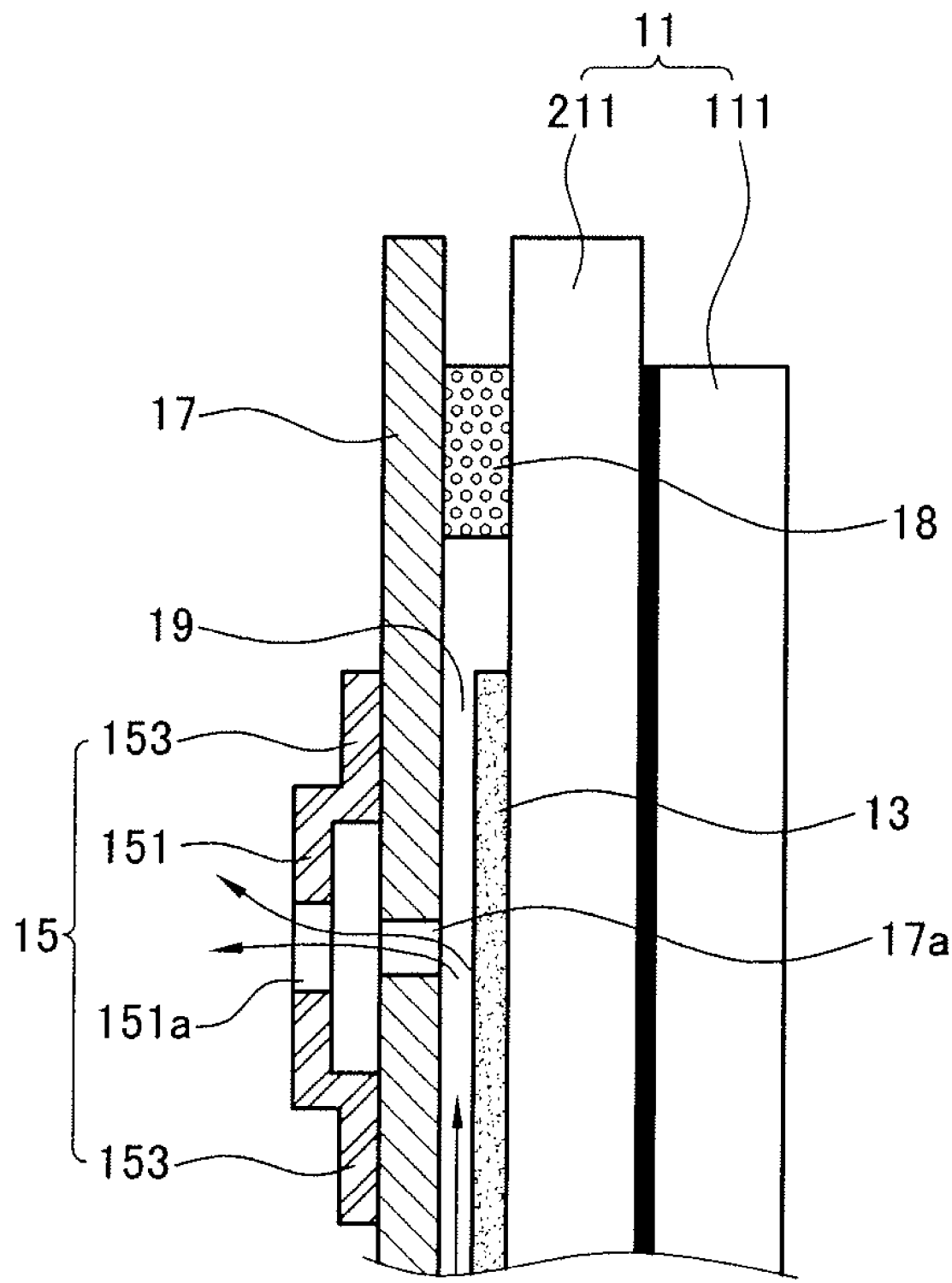
FIG. 3 is a sectional view of the plasma display device of FIG. 1 having a chassis base spaced from a PDP.

Referring to FIG. 3, the heat dissipation sheet 13 is attached to a first surface of the panel 11. Coupling members (e.g., coated tape) 18 fix the panel 11 to the chassis base 17. In one exemplary embodiment, the coupling members 18 may be thicker than the heat dissipation sheet 13 to create a space 19 between the heat dissipation sheet 13 and the chassis base 17, allowing heat from the heat dissipation sheet 13 to be transmitted to the space. The heat may then be discharged by a convection current generated in the arrow direction along the space. Since hot air is discharged through the hole 17a of the chassis base 17 and the reinforcing member hole 151a, the heat may be quickly dissipated.

Figure 4:
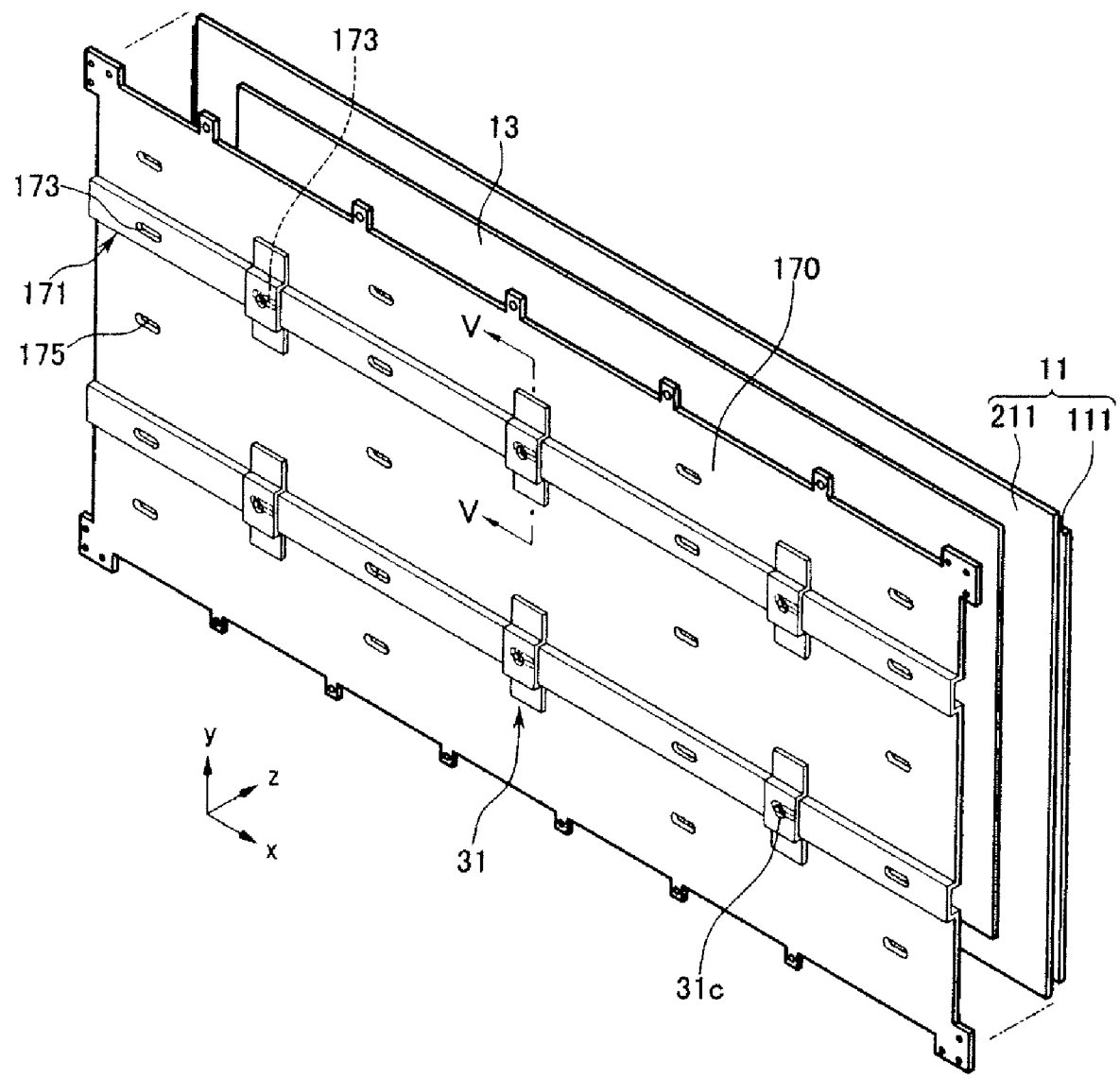
FIG. 4 is a schematic exploded perspective view of a plasma display device according to another exemplary embodiment of the present invention.

Referring to FIG. 4, another exemplary embodiment of the display device includes a panel 11, a chassis base 170, and a heat dissipation sheet 13 formed between the chassis base and the panel. The chassis base 170 faces and is coupled to the panel 11. Accordingly, the chassis base 170 may be a material (e.g., cast iron) having mechanical strength sufficient to support the load of the panel 11.

Rails 171 are formed to protrude from the chassis base 170, and in one exemplary embodiment, the rails have a substantially rectangular channel-like cross-section. The rails 171 extend longitudinally across the chassis base providing enhanced mechanical strength to the chassis base in the longitudinal direction, and in one exemplary embodiment, the rails may be integral with the chassis base 170. Additionally, the chassis base 170 is provided with at least one reinforcing member 31 formed to straddle the rails 171.

The chassis base 170 is further provided with first and second holes 173, 175, the first holes 173 being formed on the rails 171.

Figure 5:
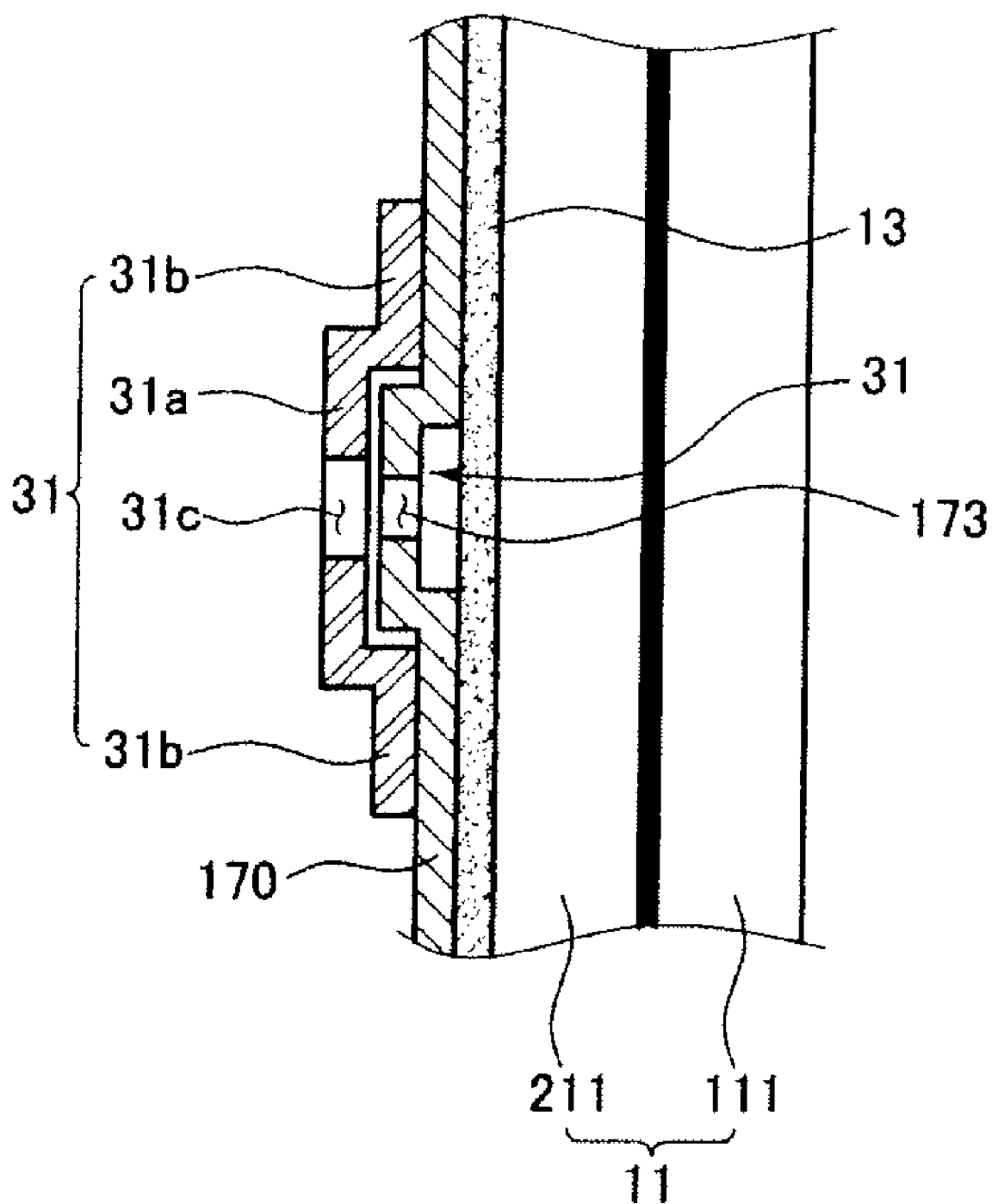
FIG. 5 is a sectional view taken along line V-V of FIG. 4.

Referring to FIG. 5, the chassis base 170 is provided with the rails 171 protruding from a planar surface of the chassis base facing away from the panel 11. Therefore, a space is defined between the rail 171 and the heat dissipation sheet 13.

Heat transmitted to the heat dissipation sheet 13 is directed to the space formed by the rail 171 and discharged to an external side through the first holes 173 formed on the rail 171. Air circulation is facilitated by the space formed by the rail 171, thereby quickly dissipating the heat. In addition, the rail 171 reduces bubbles generated between the heat dissipation sheet 13 and the chassis base 170 during adhesion of the heat dissipation sheet 13 to the chassis base 170, thereby enhancing the adhesion between the heat dissipation sheet 13 and the chassis base 170.

The reinforcing members 31 are formed across the width of the rails 171 to enhance the mechanical strength of the chassis base 170. Each reinforcing member 31 may include a first leg 31a spaced from chassis base and a second leg 31b for fixing the reinforcing member 31 to the chassis base and spacing the first leg from the chassis base. The reinforcing member 31 may further include a hole 31c to more effectively dissipate heat discharged through the first hole 173.

Figure 6:
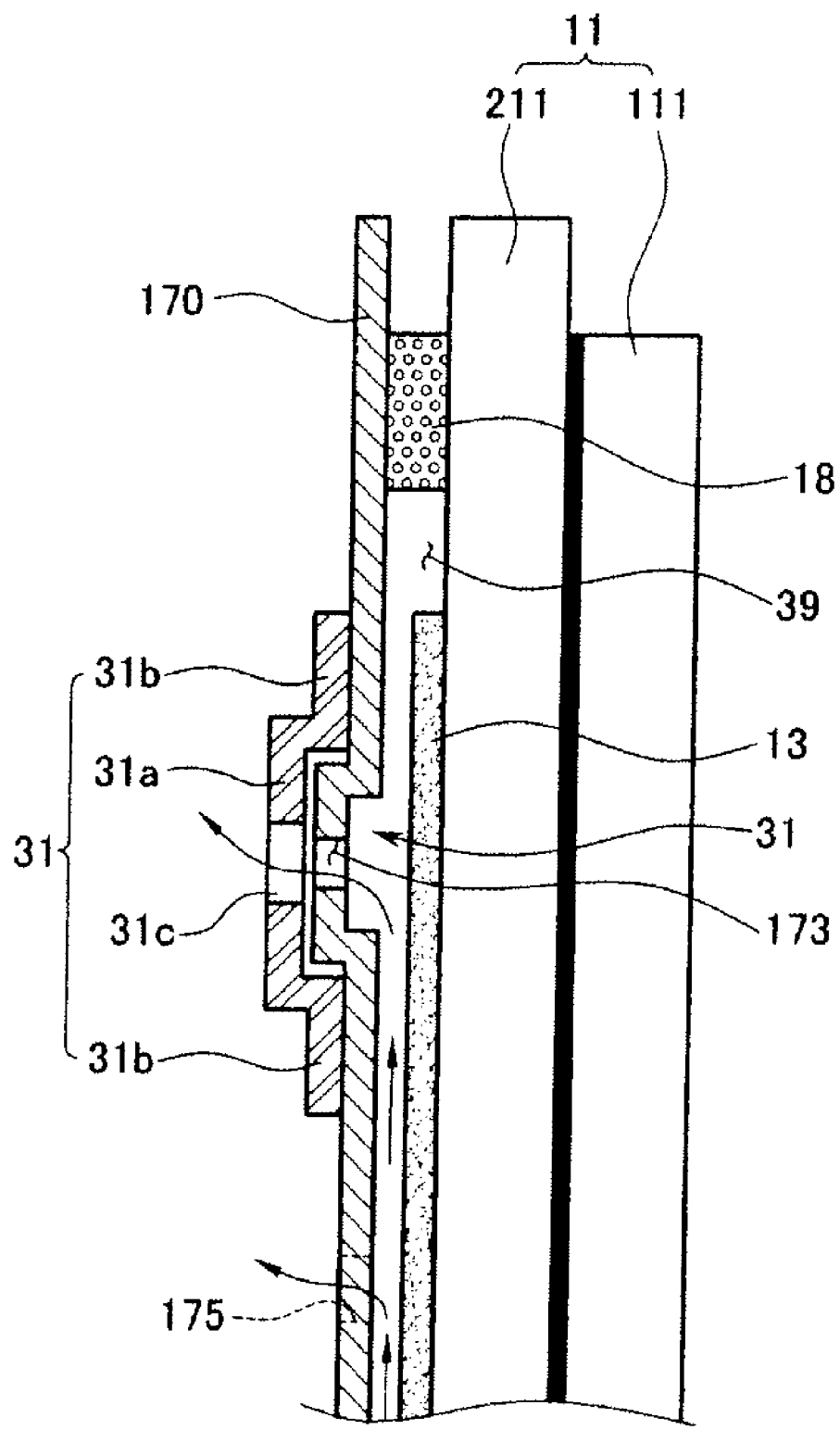
FIG. 6 is a sectional view of the plasma display device of FIG. 4 having a chassis base spaced from a PDP.

Referring to FIG. 6, another exemplary embodiment of the present invention includes the chassis base 170 being spaced from the heat dissipation sheet 13 to more effectively dissipate the heat transferred from the heat dissipation sheet 13. Coupling members (e.g., coupled coated tape) 18 fix the panel 11 on the chassis base 17. In one exemplary embodiment, the coupling members 18 may be thicker than the heat dissipation sheet 13 so that a space 39 can be defined between the heat dissipation sheet 13 and the chassis base 17. Accordingly, the heat from the heat dissipation sheet 13 is transmitted to the space 39 and then discharged by a convection current generated along the space in the direction of the arrow. Since hot air is discharged through the first holes 173 formed on the chassis base 17, hole 31c on reinforcing member 31 and the second holes 175 formed on the chassis base 17, the heat can be quickly dissipated.

Although exemplary embodiments of the present invention have been described in detail hereinabove, it should be understood that many variations and/or modifications of the basic inventive concept taught herein may still fall within the spirit and scope of the present invention, as defined by the appended claims.

For example, while embodiments of the present invention have been described in conjunction with a plasma display panel, the present invention would be applicable to other flat panel displays which may generate heat.

What is claimed is:

1. A display device comprising:
    a display panel for displaying an image;
    a chassis base coupled to the display panel to support the display panel, the chassis base having at least one chassis base heat dissipating hole; and
    at least one reinforcing member having a reinforcing member hole spaced from the at least one chassis base heat dissipating hole, the at least one reinforcing member attached to the chassis base such that the at least one reinforcing member exposes the at least one chassis base heat dissipating hole when the chassis base is coupled to the display panel.

2. The display device of claim 1, wherein the at least one reinforcing member comprises a first leg spaced from the chassis base and a pair of second legs coupled to the chassis base and configured to space the first leg from the chassis base.

3. The display device of claim 1, wherein the reinforcing member hole is on the first leg.

4. The display device of claim 1, further comprising:
    a heat dissipation sheet between the display panel and the chassis base, and
    a coupling member coupling the chassis base to the display panel;
    wherein the coupling member is thicker than the heat dissipation sheet to provide a space between the chassis base and the heat dissipation sheet.

5. The display device claim 4, wherein the coupling member extends around a periphery of the heat dissipation sheet.

6. The display device of claim 1, wherein the display panel is a plasma display panel.

7. A display device comprising:
    a display panel for displaying an image using a gas discharge;
    a chassis base having a generally planar surface, the chassis base coupled to the display panel for supporting the display panel and having at least one rail extending substantially parallel to and protruding from the planar surface of the chassis base; and at least one reinforcing member attached to the chassis base and straddling the at least one rail.

8. The display device of claim 7, wherein the at least one rail is integral with the chassis base.

9. The display device of claim 7, wherein the at least one rail provides a channel between the at least one rail and the chassis base.

10. The display device of claim 7, wherein the reinforcing member includes a first leg spaced from the chassis base and a pair of second legs coupled to the chassis base and configured to space the first leg from the chassis base.

11. The display device of claim 7, wherein the at least one rail has at least one rail hole.

12. The display device of claim 10, wherein the reinforcing member has a reinforcing member hole aligned with the at least one rail hole and exposes the at least one rail hole when the chassis base is coupled to the display panel.

13. The display device of claim 7, further comprising:

a heat dissipation sheet between the display panel and the chassis base, and a coupling member coupling the chassis base to the display panel;

wherein the coupling member is thicker than the heat dissipation sheet to provide a space between the chassis base and the heat dissipation sheet.

14. The display device claim 13, wherein the coupling member extends around a periphery of the heat dissipation sheet.

15. The display device of claim 7, wherein the display panel is a plasma display panel.

16. A reinforcing member for a display panel, the display panel including a display panel for displaying an image, and a chassis base coupled to the display panel for supporting the display panel, the chassis base having at least one chassis base heat dissipating hole, the reinforcing member comprising:

a first leg spaced from the chassis base;

a pair of second legs coupled to the chassis base and configured to space the first leg from the chassis; and a reinforcing member hole on the first leg alignable with the at least one chassis base heat dissipating hole such that the at least one chassis base heat dissipating hole is exposed through the reinforcing member hole when the chassis base is coupled to the display panel.

17. The reinforcing member of claim 16, further comprising a reinforcing member hole on the first leg.

18. The reinforcing member of claim 16, wherein the display panel is a plasma display panel.

19. A method for improving heat dissipation from a display device, the display device including a display panel for displaying an image and a chassis base coupled to the display panel for supporting the display panel, the chassis base having at least one chassis base heat dissipating hole, the method comprising:

aligning a reinforcing member with the chassis base, the reinforcing member having a first leg spaced from the chassis base, the first leg having a reinforcing member hole, and a pair of second legs configured to space the first leg from the chassis base such that the reinforcing member hole exposes the at least one chassis base heat dissipating hole; and coupling the reinforcing member to the chassis base such that the heat dissipating hole remains exposed through the reinforcing member hole.

20. The method of claim 19, wherein the display device is a plasma display device.

* * * * *

UNITED STATES PATENT AND TRADEMARK OFFICE
CERTIFICATE OF CORRECTION

PATENT NO. : 7,542,286 B2 Page 1 of 1
APPLICATION NO. : 11/744787
DATED : June 2, 2009
INVENTOR(S) : Tae-Kyoung Kang It is certified that error appears in the above-identified patent and that said Letters Patent is hereby corrected as shown below:

In the Claims

Column 6, Claim 16, line 6          After "chassis" Insert -- base --

Signed and Sealed this

Thirtieth Day of November, 2010

David J. Kappos
*Director of the United States Patent and Trademark Office*